United States Patent [19]
Buhler

[11] 3,938,055
[45] Feb. 10, 1976

[54] HIGH PERFORMANCE DIFFERENTIAL AMPLIFIER

[75] Inventor: Frederick T. Buhler, Newark, Calif.

[73] Assignee: Aeronutronic Ford Corporation (formerly Philco-Ford Corporation), Blue Bell, Pa.

[22] Filed: Jan. 17, 1975

[21] Appl. No.: 541,937

[52] U.S. Cl. .................... 330/30 D; 330/22; 330/69
[51] Int. Cl.² ......................................... H03F 3/68
[58] Field of Search ............ 330/22, 30 D, 38 M, 69

[56] References Cited
UNITED STATES PATENTS 3,894,290   12/1974   Schoeff ......................... 330/22 X
R27,351     5/1972    McGraw et al. ................. 330/30 D Primary Examiner—R. V. Rolinec
Assistant Examiner—Lawrence J. Dahl
Attorney, Agent, or Firm—Robert D. Sanborn

[57] ABSTRACT

A differential amplifier having very high common mode rejection is shown. In its simple form four transistors and three constant current sources are connected into a balanced configuration. Balance is automatic so that special component selection is not required.

5 Claims, 3 Drawing Figures

U.S. Patent  Feb. 10, 1976  3,938,055
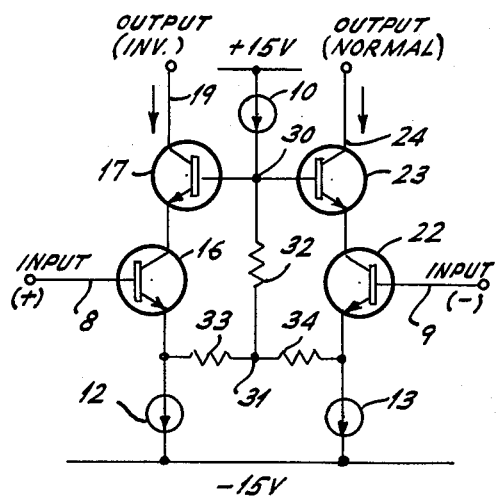
FIG. 1.
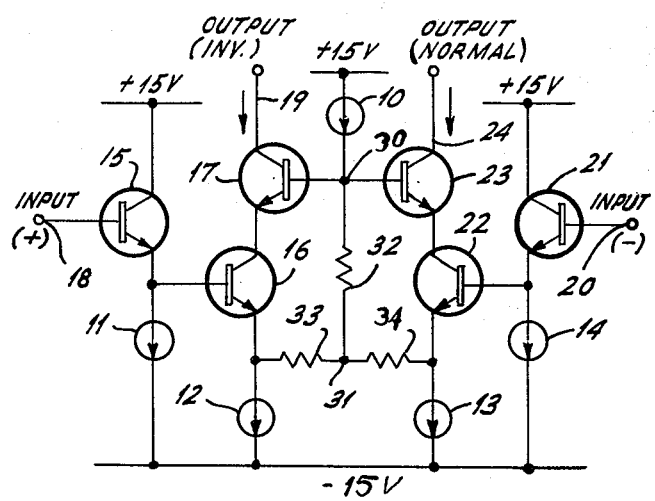
FIG. 2.
FIG. 3.
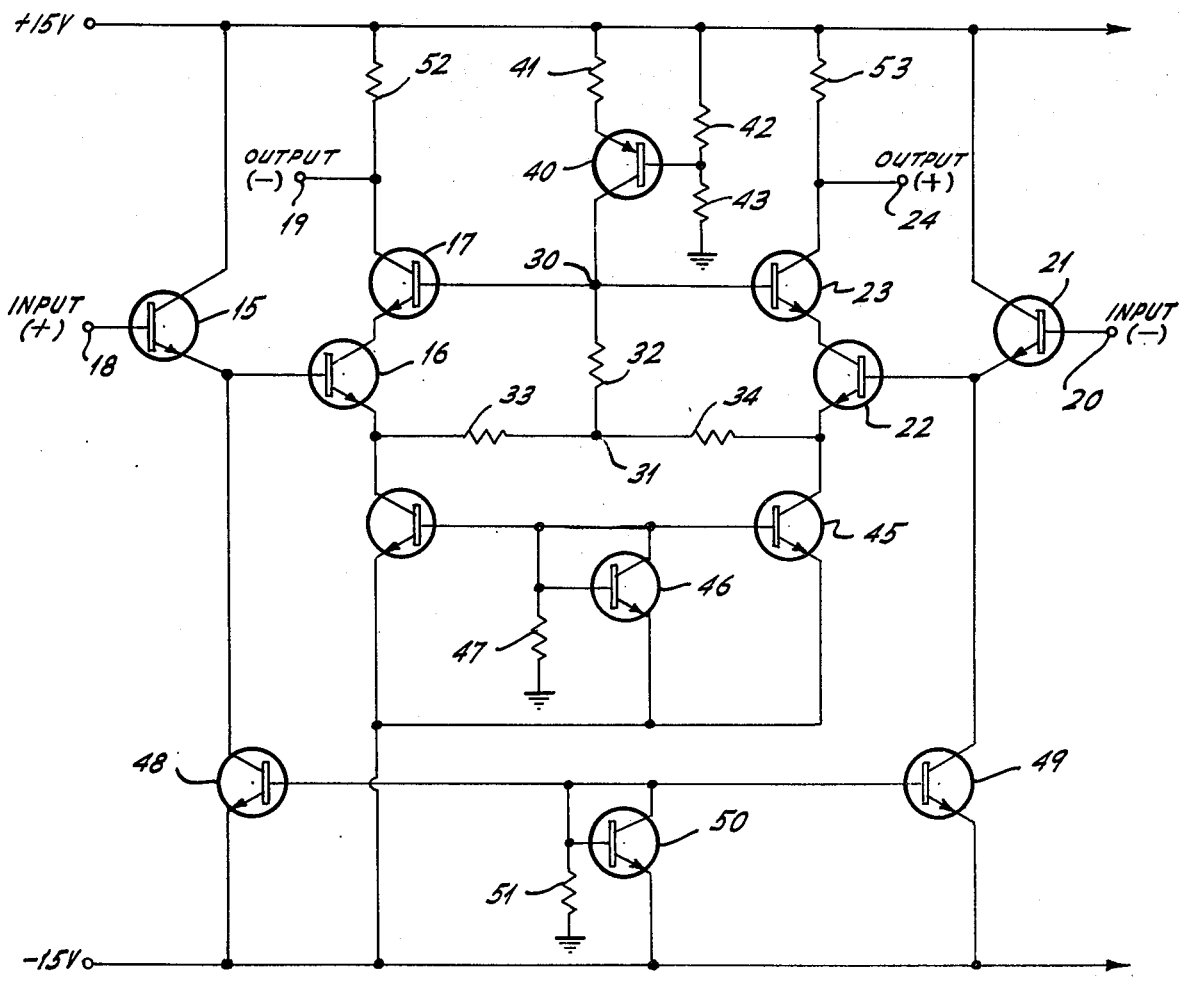

HIGH PERFORMANCE DIFFERENTIAL AMPLIFIER

BRIEF DESCRIPTION OF THE PRIOR ART

Differential amplifiers having high common rejection are well known in the prior art but their construction has required the use of carefully selected matched transistor pairs. Even then high common mode rejection was achieved over a relatively small range of common mode voltage.

SUMMARY OF THE INVENTION

It is an object of the invention to provide a circuit configuration wherein ordinary components can be used to make a high common mode rejection differential amplifier.

It is a further object to arrange conventional circuit components in a differential amplifier circuit to provide high common mode rejection over a large range of common mode voltage.

These and other objects and features are achieved in the following circuit configuration. All stages use transistors having a high degree of emitter degenerative. The input circuits are directly connected to the input bases a pair of cascode (common emitter into common base) circuits which provide the output currents. The bases of the common base transistors are tied together and biased from a constant current source and each emitter of the pair of common emitter stages is supplied from an equal value constant current source. A balanced feed back resistor network interconnects the common bases with the common emitter stage emitters, thereby providing differential cross coupling in a floating voltage level arrangement. Thus four transistors and three constant current sources make up the entire circuit. If desired isolated inputs can be employed by adding a pair of emitter follower input stages. In this case each emitter follower is supplied a constant emitter current from a suitable source.

BRIEF DESCRIPTION OF THE DRAWING

FIG. 1 is a simplified schematic diagram of the circuit of the invention;

FIG. 2 is a simplified schematic diagram of the circuit of the invention using emitter follower input stages; and FIG. 3 is a complete schematic diagram of a functional circuit showing a preferred embodiment of the invention.

DESCRIPTION OF THE INVENTION

FIG. 1, which is a simplified schematic diagram, shows a four transistor differential amplifier operated from three current sources, 10, 12, and 13. To achieve balance, current sources 12 and 13 produce equal currents. Input transistor 16 is operated from current source 12 as a common emitter driver directly connected to the emitter of common base transistor 17. Thus the collector current in transistor 16 and hence the collector current in transistor 17, which is directly driven by transistor 16, will follow the input voltage on line 8. The output voltage on line 19 will be the inverted (−) function of the voltage at input line 8.

Similarly on the other half of the circuit, which is intended to be a mirror image of the section just described, an input on line 9 will be applied to the base of transistor 22 which acts as a common emitter amplifier and is directly coupled to the emitter on transistor 23. Thus the current in transistor 22, and hence the current in transistor 23, will follow the voltage at input 9 to produce an output at line 24.

The two halves of the circuit are made to fully interact by virtue of the common direct connections. The bases of transistors 17 and 23 are connected together and operated at point 30 which is the terminal of constant current source 10. This source operates from the +15 volt power supply line. (Note that two power supplies are indicated, a +15 volt supply and a −15 volt supply, both referenced to ground or neutral potential.) Point 30 is returned to point 31 by means of resistor 32. Point 31 represents the average potential of the emitters of transistors 16 and 22 as determined by equal value resistors 33 and 34. Since the emitters of transistors 16 and 22 are operated from constant current sources 12 and 13 respectively which provide equal currents from the −15 volt power supply, the emitter voltages will follow their respective base voltages. Therefore transistors 16 and 22 float, from a voltage standpoint, at a value determined by the common mode input voltage.

The so called common mode input voltage refers to the voltages applied equally to lines 8 and 9. So long as 8 and 9 are at the same voltage there will be no response at output terminals 19 and 24. This occurs because output transistors 17 and 23 have their bases connected together and returned by way of resistor 32 to point 31 which represents the average potential at the emitters of transistors 16 and 22. Since this average potential will follow the common voltage at inputs 8 and 9, any common mode signal voltage applied to the emitters at transistors 17 and 23 will be offset by the same change in voltage at the bases at point 30. This action tends to maintain a constant collector to emitter voltage across each of transistors 16 and 22, thereby keeping them at the same operating point and reducing common mode signal amplification due to dissimilarities of the devices.

If a differential voltage appears between input lines 8 and 9. a quite different action occurs. The voltage at the bases of transistors 16 and 22 will no longer be the same therefore the currents fed to transistors 17 and 23 will be different. However since the bases of transistors 17 and 23 are still returned to the average voltage at the emitters of transistors 16 and 22 the outputs at lines 19 and 24 will fully respond to the difference in input voltages while transistors 17 and 23 fluctuate around the same operating point.

Since the differences in input will produce a directly related output, whereas a common mode input will not, the circuit essentially rejects the common mode input. The term common mode rejection is the ratio of signal output for a differential input to the signal output for the same signal value applied to the two inputs in common. Since such a ratio is dimensionless it is expressed in dB. For example a common mode rejection of 20 dB means that a 1-volt differential input will produce the same output response as a 10-volt common mode signal. Thus it can be seen that the common mode rejection is a function of how well the two halves of the circuit are balanced.

The advantage of the above described circuit lies in its high common mode rejection while using parts that do not need to be carefully selected. In effect the circuit is highly self balancing. This is due to the high degree of coupling between the two halves of the circuit and the means employed to make the circuit responses independent of device parameters.

FIG. 2 shows the elements of FIG. 1 with emitter follower isolation added. Input 18 is applied to emitter follower transistor 15, the emitter of which is supplied from constant current source 11. Input 20 is applied to emitter follower transistor 21, the emitter of which is supplied from constant current source 14. To achieve circuit balance, sources 11 and 14 are made to have equal currents.

Since transistors 15 and 21 are operated from constant current emitter sources 11 and 14, these emitter followers will have very close to unity gain independent of the transistor characteristics. Since transistors 16 and 22 have their emitters supplied from constant current sources 12 and 13 these common emitter stages will also have very close to unity gain. The common base connected stages using transistors 17 and 23 are emitter driven from high impedance drivers so that they too have very close to unity gain. It will be noted that in each stage the characteristics of the transistor will have practically no influence on the gain value.

FIG. 3 is a complete schematic diagram of a practical circuit using the invention. It will be noted that the circuit elements described in connection with FIGS. 1 and 2 employ the same numbers. Transistor 40 along with its biasing resistors 41–43 comprises constant current source 10 operating from the +15 volt power supply. Matched transistors 44 and 45 comprise constant current sources 12 and 13 respectively. Since the transistors have a common biasing source, made up of diode-connected transistor 46 and resistor 47, the currents will be equal. Matched transistors 48 and 49 comprise constant current sources 11 and 14 respectively. Since they have a common biasing source, made up of diode-connected transistor 50 and resistor 51, the currents will be equal. The above described current equalities and their application to the associated transistor emitters is responsible in part for the excellent common mode rejection.

EXAMPLE

The circuit of FIG. 3 was constructed using the following components:

| | |
|---|---|
| Transistors 15, 21, 48, 49 and 50 | — RCA CA3046 (5-NPN Transistors) |
| Transistors 16, 22, 44, 45 and 46 | — RCA CA3046 (5-NPN Transistors) |
| Transistors 17 and 23 | — 2N2369 (NPN) |
| Resistor 32 | — 1.5 K ohms |
| Resistors 33 and 34 | — 150 ohms (Matched Pair) |
| Transistor 40 | — 2N2907 (PNP) |
| Resistor 41 | — 2.2K ohms |
| Resistor 42 | — 5K ohms |
| Resistor 43 | — 10K ohms |
| Resistor 47 | — 3K ohms |
| Resistor 51 | — 7.5K ohms |
| Resistors 52 and 53 | — 300 ohms (Matched Pair) |

No particular effort was made to select parts except for the matched resistor pairs 33 and 34 and 52 and 53. The 5-transistor IC's were employed because it was convenient to do so and the common substrate construction places the transistors close together and tends to make their characteristics similar. This made the circuit less temperature sensitive because, as temperature changes, the transistor characteristics tend to change in a balanced manner thus preserving circuit balance and common mode rejection.

The circuit had a common mode rejection of over 50 dB over the frequency range of 5Hz to 1 MHz. The gain of the circuit was about 1 when operated single ended (that is taking one output with respect to ground) and about 2 when operated in the differential mode (that is taking one output with respect to the other output). The common mode input could be driven between the limits of about +9 to about −13 volts while maintaining the excellent common mode rejection.

The amplifier input impedance approximated a resistance in excess of 1.5K ohms shunted by a capacitance of less than 30 pFarads. Thus the amplifier is easily driven over great bandwidths by terminated transmission lines in the 75-ohm impedance range.

The foregoing has disclosed a high performance differential amplifier and an example given showing its excellent performance. Clearly equivalents and alternatives will occur to a person skilled in the art. For example while the circuit is shown in discrete device form, it is clear that the circuit would be quite suitable for integrated microcircuits either hybrid or monolithic type. Accordingly it is intended that my invention be limited only by the following claims.

I claim:

1. A differential amplifier comprising an input pair of transistors connected as base driven common emitter amplifiers, said input pair having the emitter of each element connected to a separate one of a first pair of constant current sources, said first pair of sources having equal current characteristics, an output pair of transistors connected as common base transistors emitter driven from the collectors of said input pair, the base electrodes of said output pair being connected together and supplied from a constant current source independent from said first pair of constant current sources, a matched pair of resistors elements series connected between the emitter electrodes of said input pair, and a resistor connected between the juncture of said matched pair of resistors and the base electrodes of said output pair.

2. The amplifier of claim 1 wherein each one of said input pair of transistors is driven by an emitter follower amplifier stage, each emitter follower having its emitter connected to one of a second pair of constant current sources, said second pair of sources having equal current characteristics.

3. The amplifier of claim 2 wherein each one of said constant current sources comprises the collector circuit of a transistor, said transistor being connected to a constant voltage bias source.

4. The amplifier of claim 3 wherein said first and said second pairs of constant current sources each comprise a pair of transistors having their emitters and bases connected together and biased by a constant voltage source with said voltage magnitude determining the value of said constant currents.

5. The amplifier of claim 4 wherein said pair of transistors is located on a common substrate and in close physical proximity.

* * * * *